United States Patent
Smith et al.

[11] Patent Number: 5,995,367
[45] Date of Patent: Nov. 30, 1999

[54] HEAT EXCHANGER HAVING AN EXTRUDED, TIERED HEAT SINK

[75] Inventors: Dean L. Smith, Pittsford; Edmund J. Sobresky, Batavia; Roger S. Kerr, Brockport, all of N.Y.

[73] Assignee: Eastman Kodak Company, Rochester, N.Y.

[21] Appl. No.: 08/992,891

[22] Filed: Dec. 18, 1997

[51] Int. Cl.$^6$ ........................................ H05K 7/20
[52] U.S. Cl. .................. 361/695; 361/687; 361/704; 257/712; 165/78; 174/16.3
[58] Field of Search ................... 361/683–689, 361/690–697, 704–712; 165/80.3, 80.4, 121, 78, 146, 185, 104.21, 104.33, 104.34, 102.21; 257/706–727, 222; 29/890.035; 174/16.3, 252

[56] References Cited

U.S. PATENT DOCUMENTS

| | | | |
|---|---|---|---|
| 5,042,257 | 8/1991 | Kendrick et al. | 62/3.1 |
| 5,146,144 | 9/1992 | Lee | 318/138 |
| 5,583,317 | 12/1996 | Mennucci et al. | 174/16.3 |
| 5,832,986 | 11/1998 | Kenny et al. | 165/80.3 |

OTHER PUBLICATIONS

Walker, *Industrial Heat Exchangers, A Basic Guide*, pp. 28–31, 2nd. Ed., 1990.

*Primary Examiner*—Donald Sparks
*Assistant Examiner*—Michael Datskovsky
*Attorney, Agent, or Firm*—Clyde E. Bailey, Sr.

[57] ABSTRACT

An improved heat exchanger (10) has an extruded, multi-tiered heat sink (22) having a very high heat transfer coefficient structurally associated with a compact, high air velocity air moving means (14). Heat sink (22) has a first tier (56) formed by first fins (34) in a first base element (24) closely spaced apart from third fins (40) in an extruded bridging element (30). A second tier (60) of heat sink (22) is formed by second fins (52) in a second base element (26) closely spaced from fourth fins (46) opposing the third fins (40) in the bridging element (30). Air moving means (16) of the invention employs a backward curved impeller (14) driven by a compact planar dc motor (80) adapted to yield higher than normal impeller speeds with superior thermal transfer performance.

10 Claims, 6 Drawing Sheets though tubeaxial fan must overcome. At some point, increasing the surface area will decrease heat sink performance, as the fan invariably becomes the limiting factor in the amount of air

HEAT EXCHANGER HAVING AN EXTRUDED, TIERED HEAT SINK

CROSS REFERENCE TO RELATED APPLICATIONS

This invention is related to commonly owned U.S. patent application, Ser. No. 08/988,804 filed on Dec. 11, 1997, entitled, "Extruded, Tiered High Fin Density Heat Sinks And Method Of Manufacture", by Dean L. Smith, Edmund J. Sobresky, and Roger S. Kerr.

FIELD OF THE INVENTION

The invention relates generally to heat exchangers, and more particularly, the invention concerns an improved heat exchanger having an extruded, multi-tiered heat sink with a high heat transfer coefficient in conjunction with a compact air moving device capable of achieving high air velocities and overcoming high static pressure thereby producing greater thermal performance.

BACKGROUND OF THE INVENTION

Heat exchangers or devices for enhancing or facilitating the flow of heat are numerous in the art. They exist in a range of sizes and for a wide range of applications. The smallest are included, for instance, in miniature cryocoolers for infrared thermal imaging, superconducting electronic applications, and the like. At the other extreme, the largest heat exchangers are those found in electric power stations. In either case, the thermal performance of heat exchangers is generally related to the frictional pressure drop or static pressure drop through the heat sink.

It is well known for turbulent flow that the thermal ability of a heat exchanger can be improved by increasing the ability of the air mover to overcome resistance to flow or static pressure losses through the heat sink. Experience indicates that with narrow fluid passageways in the heat sink, static pressure plays a prominent role in the thermal performance of the heat exchanger. A suitable air moving element, such as a blower or fan, is usually structurally associated with the heat sink to aid in facilitating the heat transfer process. This is done by increasing the surface area of the heated body or surface in contact with the cooling air stream. Another technique to improve the heat transfer process is to increase the air velocity through the heat sink. Both of the above techniques involves decreasing the thermal resistance of the component surface to the air stream.

Depicted in FIG. 1, a prior art heat exchanger 1 for electronic devices typically employs a tubeaxial fan 2 directly mounted to the heat sink 3 having a plurality of fins 4. These existing devices, of the type illustrated in FIG. 1, are generally limited in the amount of fin surface area that can be provided for any given heat sink volume, due to the limited static pressure capability of the tubeaxial fan 2. Remote mounted blowers may also be used but, they have the inherent disadvantage of not offering a compact solution that can run independent from the rest of the system. In addition, having a remote mounted blower complicates the design due to the routing of the ducting. Where compact systems are required, these remote blowers are not an option. A shortcoming of the tubeaxial fan is its inability to overcome any appreciable resistance to airflow. Increasing the fin surface area increases the airflow resistance that the tubeaxial fan must overcome. At some point, increasing the surface area will decrease heat sink performance, as the fan invariably becomes the limiting factor in the amount of air flow resistance it can overcome. Thus, for a given heat sink volume, there is a limit to the thermal resistance that a direct mounted tubeaxial fan can provide.

Therefore, there persists a need for a heat exchanger that is compact, has an air mover that supplies enough power to generate high air velocities and to overcome static pressure in the heat sink, is reliable and requires low maintenance, and that is inexpensive to manufacture.

SUMMARY OF THE INVENTION

It is, therefore, an object of the invention to provide an improved heat exchanger that can achieve superior thermal performance.

Another object of the invention is to provide an improved heat exchanger that is easy to manufacture, light weight, compact and is cost effective.

Yet another object of the invention is to provide an improved heat exchanger that has greater reliability and requires less maintenance than existing units.

It is a feature of the invention that the improved heat exchanger of the invention includes an extruded, multi-tiered heat sink having very narrow fluid passageways in each tier, and therefore high resistance to fluid flow, which cooperates with a compact, high air velocity air moving means capable of overcoming the static pressure in the heat sink.

To overcome one or more problems in the prior art, there is provided in one aspect of the invention, an improved heat exchanger, comprising an extruded, multi-tiered heat sink having an extruded, tiered high fin density heat sink which includes an extruded first base element having a plurality of parallel first fins extending outwardly from a common first face with nearest adjacent first fins having a first recess formed therebetween in the common first face. Further, an extruded second base element has a plurality of parallel second fins extending outwardly from a common second face with nearest adjacent second fins having a second recess formed therebetween in the common second face.

In addition to extruded first and second base elements, the heat sink of the invention includes an extruded bridging element having a third common face and an opposing fourth common face for joining the first and second base elements. According to our invention, third common face has a plurality of parallel third fins extending outwardly from the third common face with nearest adjacent third fins having a third recess formed therebetween in the common third face. Likewise, fourth common face of the bridging element has a plurality of parallel fourth fins extending outwardly from the fourth common face with nearest adjacent fourth fins having a fourth recess formed in the common fourth face.

In a preferred embodiment of the invention, the bridging element is arranged between the first and second base elements in a manner such that an end edge portion of each of the first fins is fixedly bonded in an opposing third recess in the bridging element. Further, an end edge portion of each of the third fins is fixedly bonded in an opposing first recess of the first base element thereby forming a plurality of fluid passageways between the first and third fins. Moreover, an end edge portion of each of the second fins of the second base elements is fixed in a fourth recess of the bridging element. To securely join the two elements, an end edge portion of each of the fourth fins of the bridging element is fixedly bonded in a second recess of the second base element thereby forming a plurality of fluid passageways between nearest adjacent second and fourth fins.

Further, an air moving means is structurally associated with the heat sink. In this embodiment of the invention, the air moving means comprises at least a partial enclosure configured to provide a directional fluid path from outside the enclosure into and through the enclosure. An impeller is arranged for rotational movement in the enclosure. The impeller has a plurality of backward curved blades exposed to an opening in the enclosure for convectively moving fluid into the enclosure and along the directional fluid flow path through the plurality of fluid passageways of the heat sink. Moreover, the impeller, operably connected to drive means, is capable of producing a fluid velocity and static pressure to force fluid outside the enclosure through the closely spaced fins of the heat sink.

It is, therefore, an advantageous effect of the invention that an improved heat exchanger having far superior thermal performance is compact, light weight, cost effective, reliable and easy to maintain.

BRIEF DESCRIPTION OF THE DRAWINGS

The foregoing as well as other objects, features and advantages of this invention will become more apparent from the appended Figures, wherein like reference numerals denote like elements, and wherein.

DETAILED DESCRIPTION OF THE INVENTION

Figure 1:
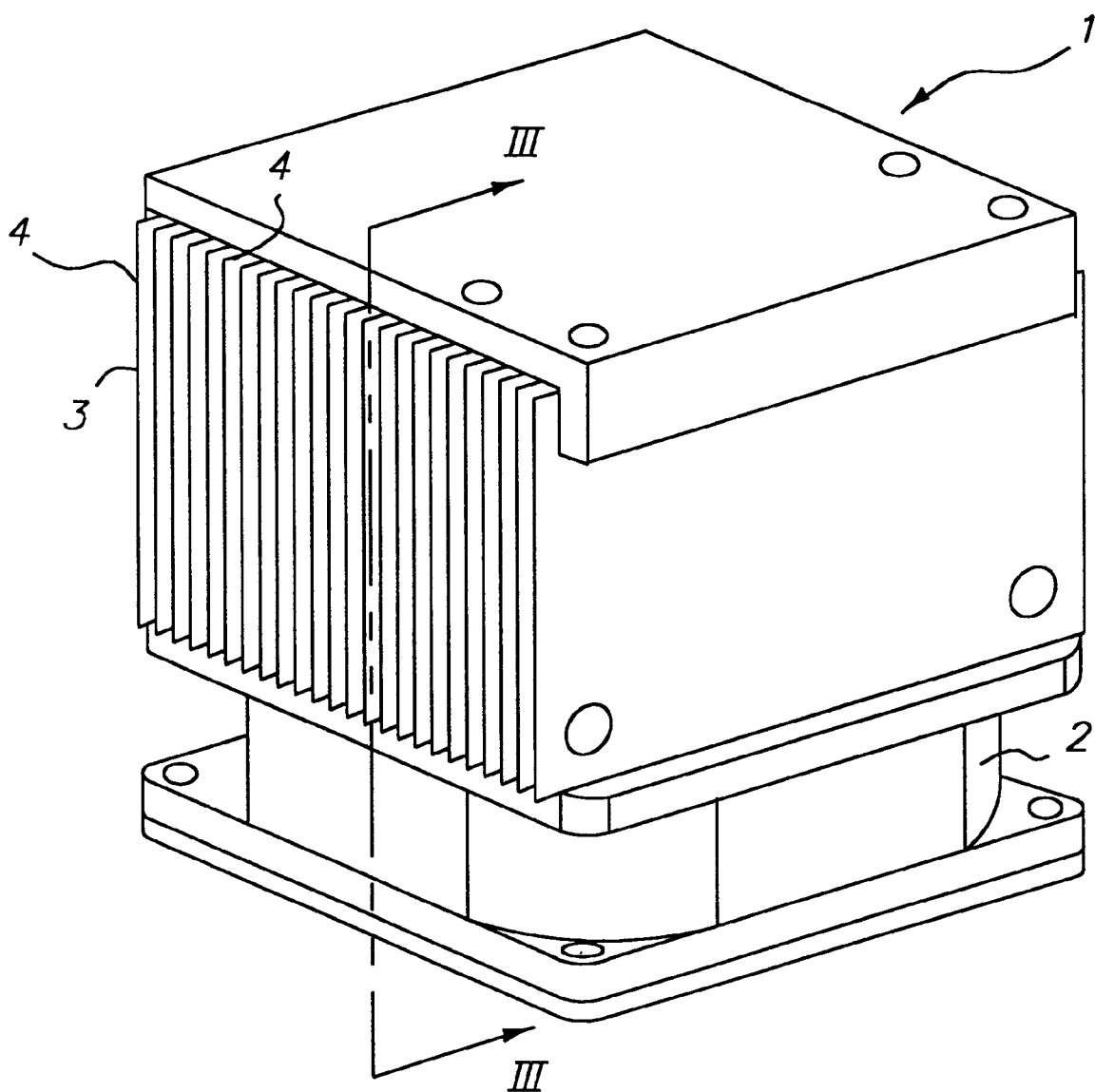
FIG. 1 shows a prior art heat exchanger.
Figure 2:
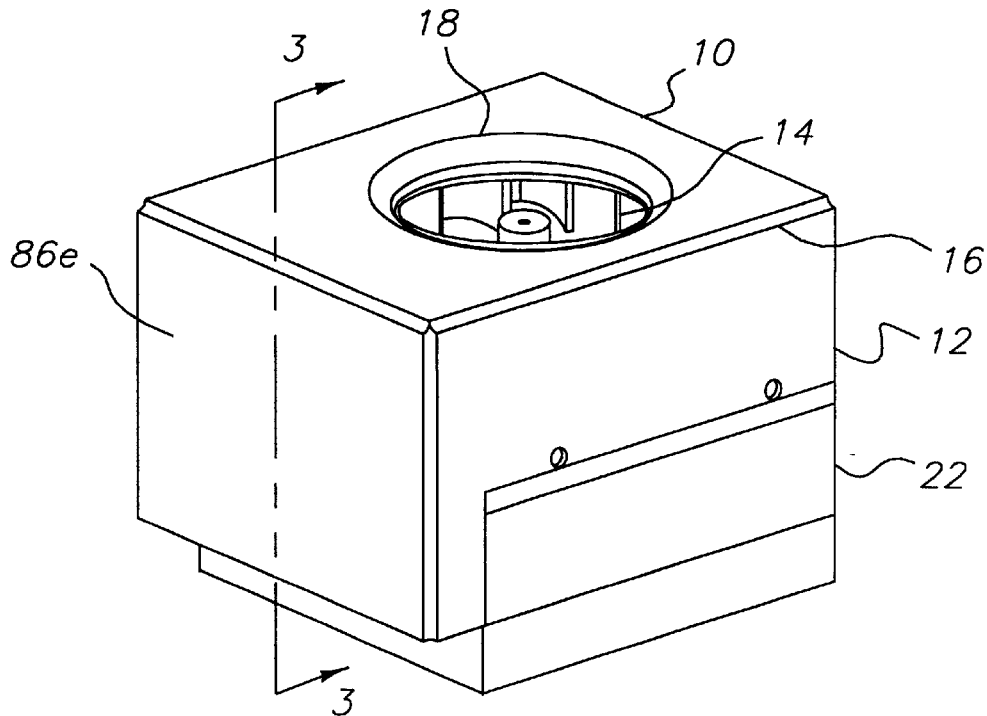
FIG. 2 is a perspective view of the heat exchanger of the invention showing the fan and heat sink.
Figure 3:
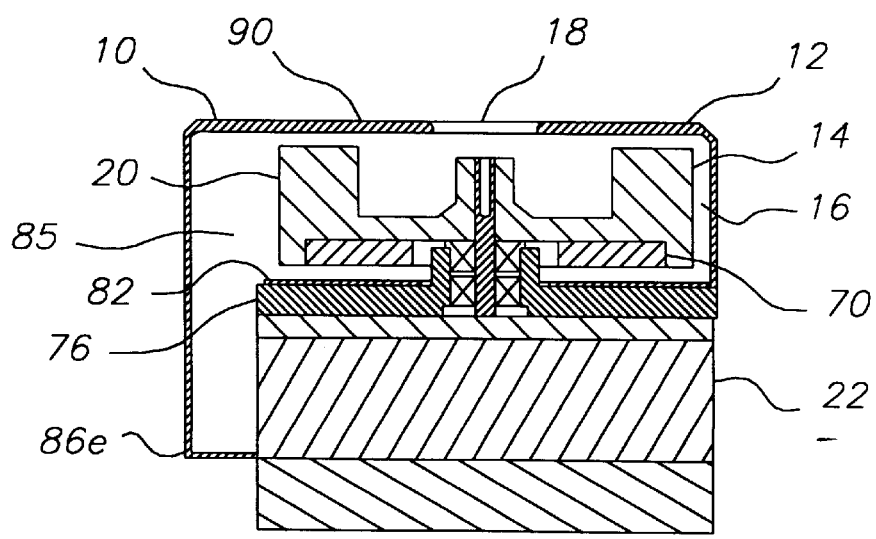
FIG. 3 is a section view along lines III—III of FIG. 2.

Turning now to the drawings, and in particular to FIGS. 2 and 3, the improved heat exchanger 10, in accordance with the principles of the invention, is illustrated. According to FIGS. 2–3, heat exchanger 10, broadly defined, has at least a partial enclosure or housing, 12 and a compact fluid or air moving means, preferably a fan, 16, having impeller 14 (described below), exposed in an opening 18 of housing 12. Impeller 14, as discussed below, comprises a plurality of backward curved blades 20 which forcefully direct air through the enclosure 12. Cooperatively associated with air moving means 16 and arranged in enclosure 12 is an extruded, multi-tiered heat sink 22 (as described fully below) for absorbing and then dissipating fluid (heat), as described fully below. Air moving means 16, described herein, is structurally connected to heat sink 22 with preferably low thermal resistant screws and washers (not shown). Those skilled in the art will appreciate that air moving means 16 need not be connected to heat sink 22 nor limited to a single heat sink 22. It is, therefore, within the contemplation of the invention that a single air moving means can provide forced convection of fluid (air) moving through a plurality of heat sinks 22. Other important detailed features of the heat sink 22, air moving means 16 and enclosure or housing 12 are defined in greater detail herein below.

Heat Sink (22)

Figure 4:
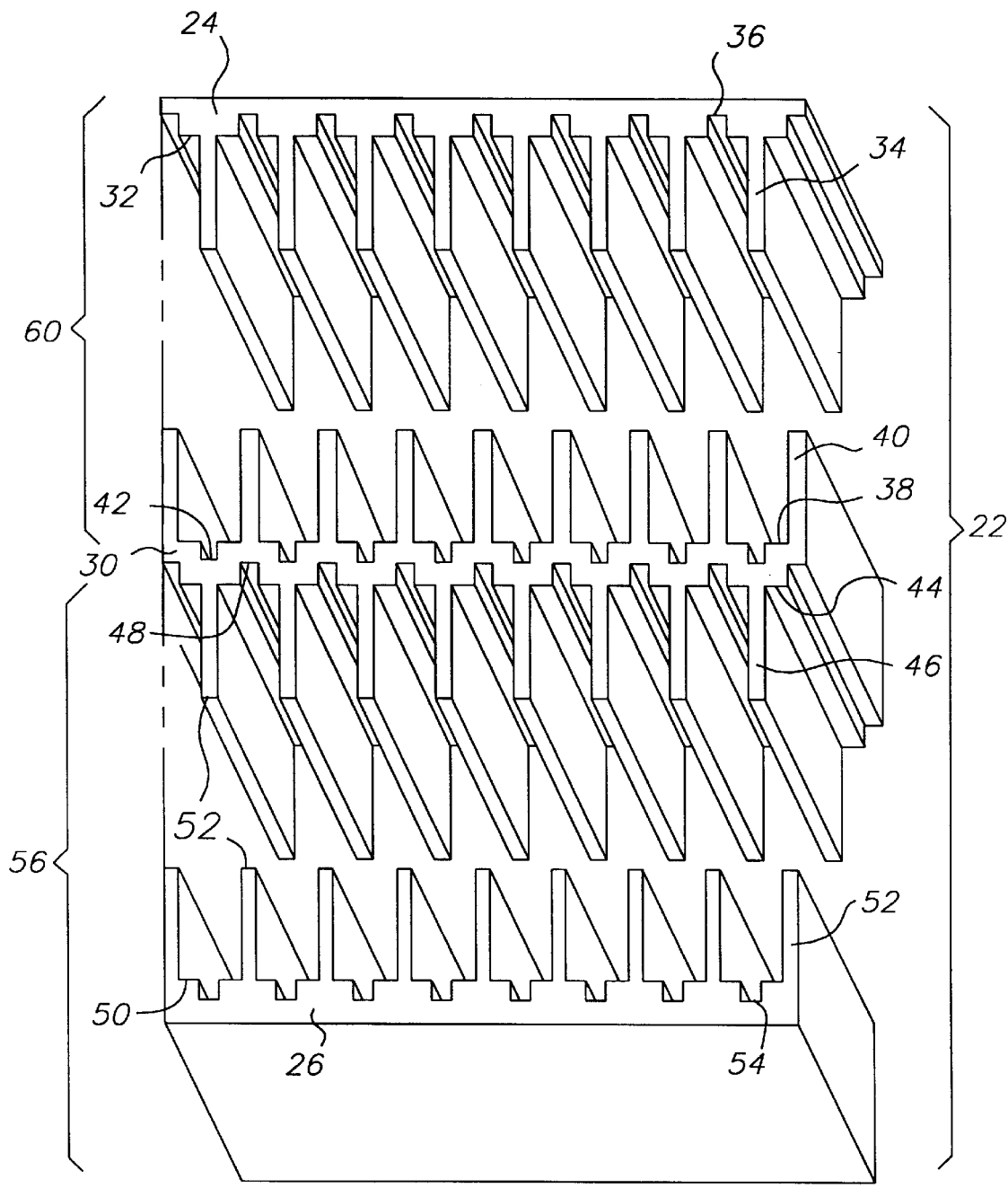
FIG. 4 is an exploded view of the heat sink showing first base, second base and bridging elements.

Turning now to the drawings, and more particular to FIG. 4, there is illustrated the extruded, high fin density heat sink 22 manufactured in accordance with the principles of the invention. More particularly, heat sink 22 (of the type described in U.S. patent application Ser. No. 08/988,804, hereby incorporated herein by reference) includes extruded first and second base elements 24, 26 and bridging element 30. As best seen in FIG. 4, extruded first base element 24 has a common first face 32 that accommodates a plurality of vertically extending, substantially parallel, spaced first fins 34. Between nearest adjacent spaced first fins 34 is formed a first recess channel 36 which extends lengthwise between the adjacent first fins 34.

Similarly, as best seen in FIG. 4, extruded bridge element 30 includes a common third face 38 that accommodates a plurality of vertically extending, substantially parallel, spaced third fins 40. Further, one of a plurality of similar third recesses 42 is formed in the common third face 38 between adjacent third fins 40.

Similarly, as best seen in FIG. 4, extruded bridging element 30 includes a common fourth face 44 opposite common third face 38. Common fourth face 44 has a plurality of vertically extending, substantially parallel, spaced fourth fins 46. Moreover, a plurality of similar fourth recesses 48 is formed in the common fourth face 44 between adjacent fourth fins 46.

Depicted in FIG. 4, extruded second base element 26 has a common second face 50 that accommodates a plurality of vertically extending, substantially parallel, spaced second fins 52. Between nearest adjacent spaced second fins 52 is formed a second recess 54 in the common second face 50 which extends between adjacent second fins 52. Skilled artisans will appreciate that multiple or partial bridging elements may be used to construct a heat sink having a desired number of tiers.

Figure 5:
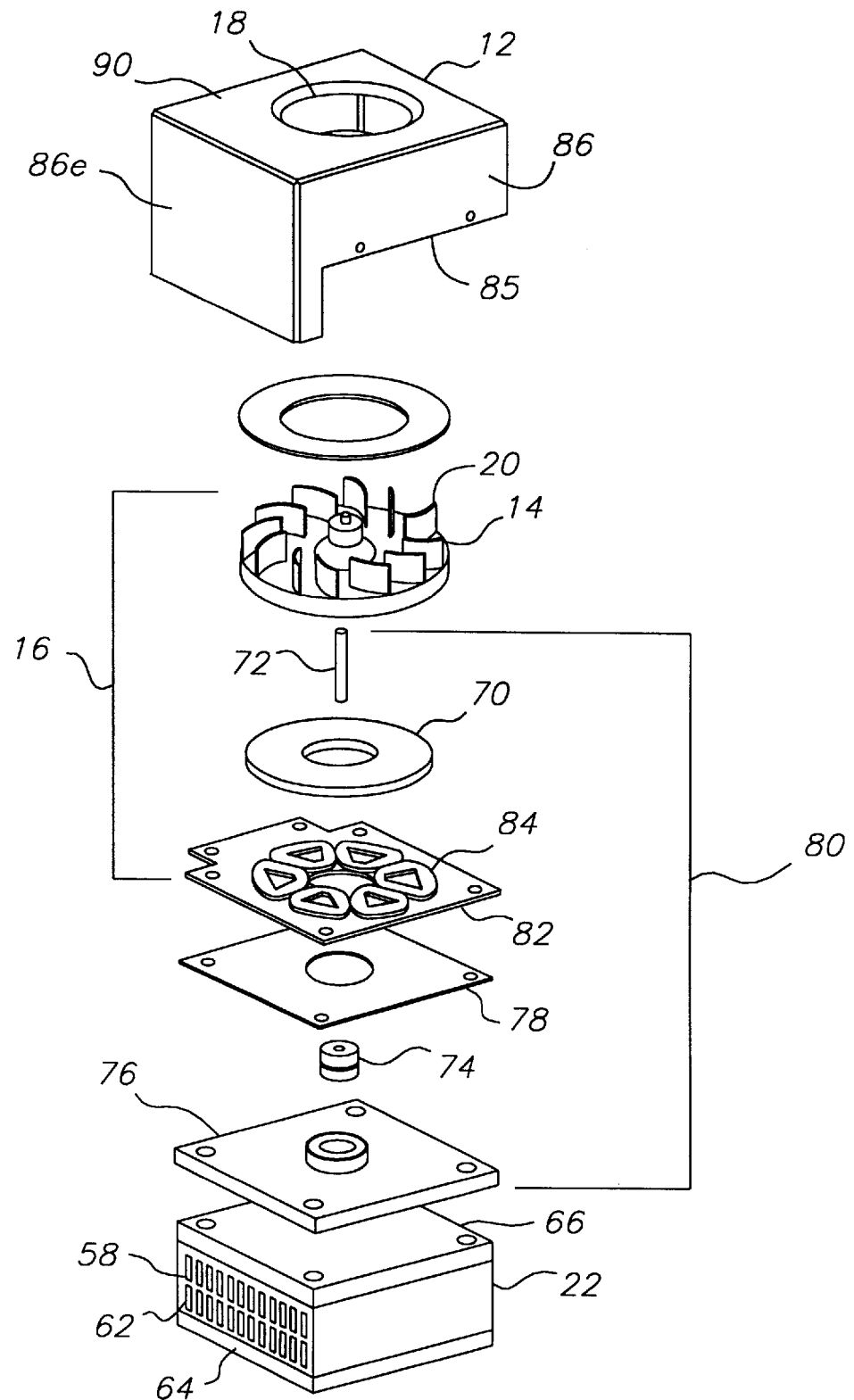
FIG. 5 is an exploded view of the air moving means of the invention.

Illustrated in FIGS. 4 and 5, one tier 56 of heat sink 22 has a plurality of fluid flow passageways 58 formed between nearest adjacent first and third fins 34, 40 in the bonded first base element 24 and the bridging elements 30. Likewise, another tier 60 of heat sink 22 has a plurality of fluid flow passageways 62 formed between nearest adjacent second and fourth fins 52, 46 in the bonded second base element 26 and bridging element 30 of heat sink 22. Fluid flow passageways 58, 62 in both tiers 56, 60, respectively, enable fluid, such as heat from a heat generating body (not shown) to pass through an air inlet 64 of the heat sink 22 before exiting an air outlet 66 during thermal cooling.

In the preferred embodiment, the plurality of closely spaced fins in both tiers 56, 60 have an average space width ($S_f$), illustrated in FIG. 4, of around 3½ to 4 times the thickness of the respective fins. The lower limit of the average space width ($S_f$) is determined by the present manufacturing capabilities and/or mechanical stability and/or uniformity of the fin. For common aluminum 6061 and 6063 alloys, we prefer a ratio of fin thickness to fin height of around 1/10 where the fin is about 0.050 inches (1.27 mm) at the tip.

An important property of heat sink 22 is the heat transfer coefficient of the plurality of fins in the first and second tiers 56, 60. It is well known that the convective heat transfer coefficient varies widely, over several orders of magnitude, and depends principally on the fluid velocity, the characteristics of the fluid, and, very importantly, on whether the fluid is experiencing a change of phase. (See for instance Walker, *Industrial Heat Exchangers, A Basic Guide,* pages 28–31, 2nd Ed, 1990.) Thus, according to conventional theory, the heat transfer coefficient is defined by the equation $$h = Nu \cdot k/De$$

where h is the convective heat-transfer coefficient, Nu is the Nusselt Number, a dimensionless number, and k is the thermal conductivity of the fluid; and De is the equivalent or hydraulic diameter of the formed fluid passageway. In this configuration, $$De = 4Ac/P,$$

where Ac is the flow cross sectional area of a fluid passageway, and P is the wetted perimeter or the surface area of the plurality of fins in the first and second tiers 56,60 exposed to the fluid.

In the present invention, the plurality of fins in the first and second tiers 56, 60 has a heat transfer coefficient (h) up to about 20 Btu/hr.-ft$^2$ deg F. For laminar forced convection heat transfer in ducts with fully developed temperature and velocity profiles, the Nusselt Number is constant. For a cross-sectional duct with a large aspect ratio and a constant wall temperature, the Nusselt Number converges to 7.54. The hydraulic diameter for a channel 0.038 inches wide by 0.2 inches tall is 0.0053 feet. Using the thermal conductivity of air as 0.0152 Btu/hr.-ft$^2$ deg F., the heat transfer coefficient (h) is therefore calculated to be 20 Btu/hr.-ft$^2$ deg F. It is important to appreciate that this high a value of heat transfer coefficient (h) was not obtainable in a compact heat exchanger, due to the inability of the tubeaxial fan to overcome high static pressures.

Referring again to FIG. 4, the plurality of fins in the first and second tiers 56, 60 are preferably generally rectangularly shaped and planar.

Air Moving Means (16)

According to FIGS. 2–5, improved heat exchanger 10 of the invention includes air moving means 16 in fluid communication with both first and second tier 56, 60 of heat sink 22, as described above. Shown clearly in the exploded view of FIG. 5, air moving means 16 comprises at least a partial enclosure or housing, 12, which is configured to direct fluid into the enclosure 12 and then direct the fluid through enclosure 12, as described below. Impeller 14 is arranged for rotational movement in the enclosure 12. Further, impeller 14 has a plurality of backward curved blades 20 exposed to opening 18 in enclosure 12 for convectively moving fluid into the at least partial enclosure 12. Thereafter, the convectively moving fluid travels through the air inlet 64 and then through the plurality of fluid passageways 58, 62 of tiers 56, 60 of the heat sink 22 before exiting the air outlet 66 of heat sink 22. It is important to the invention that impeller 14 is capable of producing a fluid velocity and static pressure to force fluid from a heat generating body (not shown) through the opening 18 of enclosure 12 and then through the closely spaced fins of first and second tiers 56, 60 of the heat sink 22.

Referring again to the exploded view of FIG. 5, air moving means 16 is depicted having housing 12 and an impeller 14 disposed in the housing 12. Further, a permanent magnet 70 is mounted to impeller 14 and a drive shaft 72. Magnet 70 cooperates with the drive means, discussed below, for controlling the rotation of impeller 14. Moreover, base assembly (not shown) includes bearings 74 to hold the shaft 72, a base plate 76 to accept the bearings 74, and a flux return plate 78 to minimize eddy current losses in the drive means 80, described below.

Illustrated in FIGS. 3 & 5, drive means, preferably a compact dc motor, 80, operably connected to the impeller 14 is provided for producing the rotational movement of the impeller 14 in enclosure 12. DC motor 80 comprises a circuit board 82 for actuating the motor. Circuit board 82 includes a plurality of metallic coils 84 arranged in magnetic proximity to magnet 70 mounted to the impeller 14. The metallic coils 70 are configured to receive a current and thereby produce rotational movement of the impeller 14 in response to the current. Utilizing planar motor technology coupled with backward curved impeller design, illustrated in FIG. 5, we are now able to produce the dc motor/fan combination of the invention with superior air flow characteristics. The planar dc motor technology makes use of a small compact motor, the preferred drive means, 80, with the capacity to deliver relatively high torque to size ratios. Operably associated with the backward curved impeller 14, the dc motor enables the impeller 14 to achieve much higher fluid flow rates and overcome abnormally high static pressures.

It is well known that the fins of the heat sink present a fundamental problem in the removal of heat because it is fundamentally more desirable to employ as many fins as practical and to make them as tall as practical to increase the surface area to aid in the removal of the heat. There becomes a practical limit to the height of the fin, as the taller the fin, the lower the fin efficiency. Anything higher than this practical limit has negligible impact on increasing the heat transfer. Consequently, when short fins with small spacing $S_f$ are used, the restriction to air flow is greatly increased. As indicated, conventional air movers do not have the static pressure capacity to achieve a high velocity through the heat sink, thus limiting their thermal performance. Using the heat exchanger 10 of the invention, it is now possible to employ therewith a backward curved impeller 14, as described herein, driven by a direct mounted, small dc motor (see for instance commonly owned U.S. Pat. No. 5,146,144, hereby incorporated herein by reference) with sufficient speed/torque characteristics to overcome the restriction in the fluid passageways 58, 62 formed by the plurality of closely spaced fins in the first and second tier 56, 60. Moreover, the heat exchanger 10, as described, is adapted to drive fluid (air) at a high velocity through the heat sink, thus achieving superior thermal performance. The direct mounted planar motor blower can therefore match the performance that a removable mounted blower can provide, while maintaining the advantage of a compact and self contained solution that previously was unobtainable.

Figure 9:
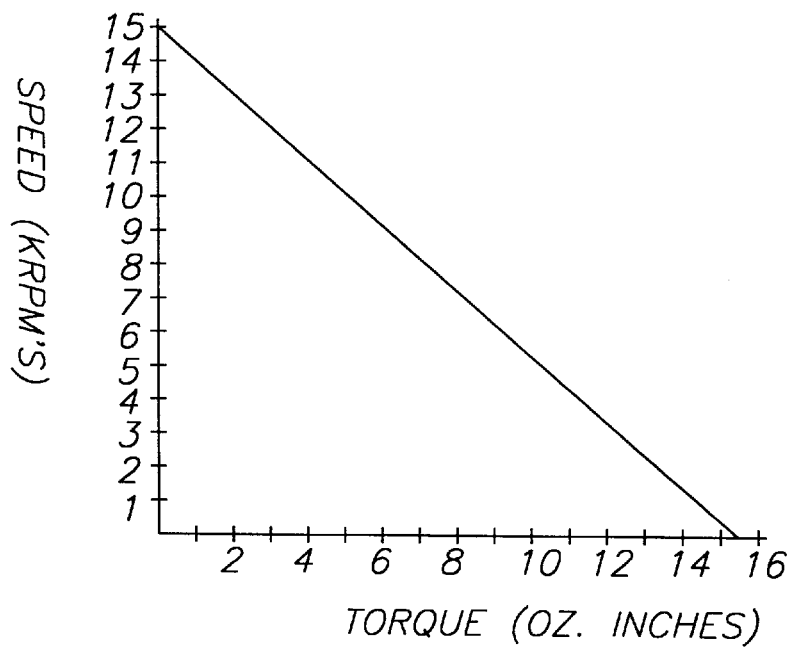

More particularly, according to performance curve in FIG. 9, drive means or dc motor 80 is configured to produce an impeller speed of about 4000 RPM to about 15000 RPM. Further, FIG. 9 provides the full range of speeds that impeller 14 is capable of achieving by employing the preferred dc motor of the invention.

Figure 6:
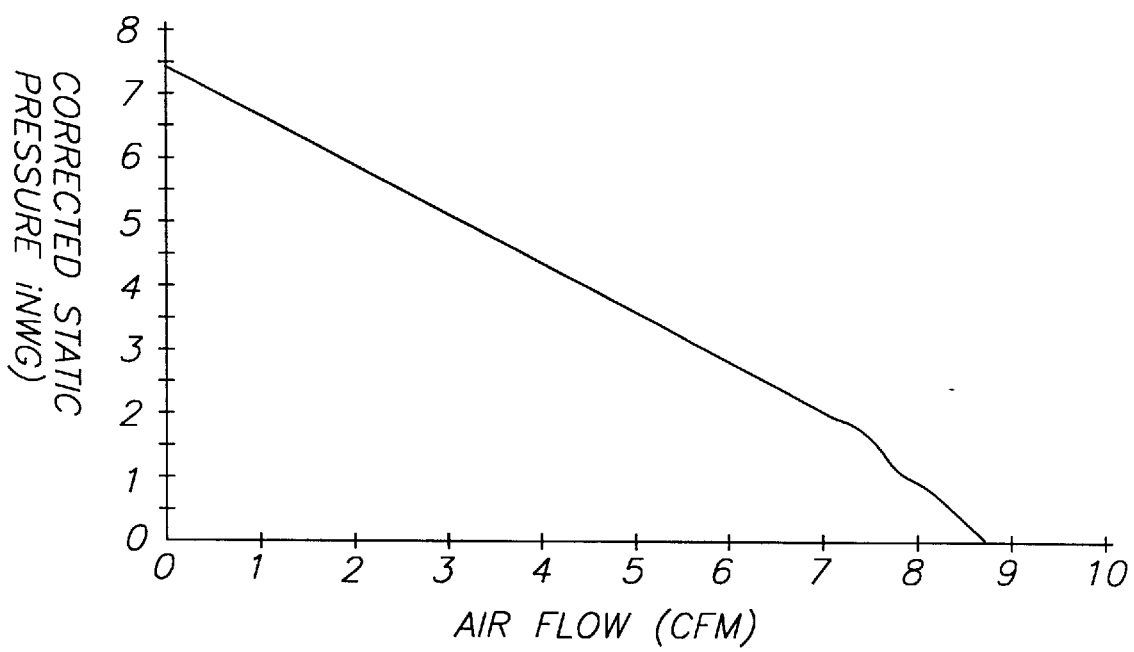
FIGS. 6–8 show typical air mover performance curves for different impeller inlet diameters; and, FIG. 9 shows the speed torque curve for the drive motor of the invention.
Figure 7:
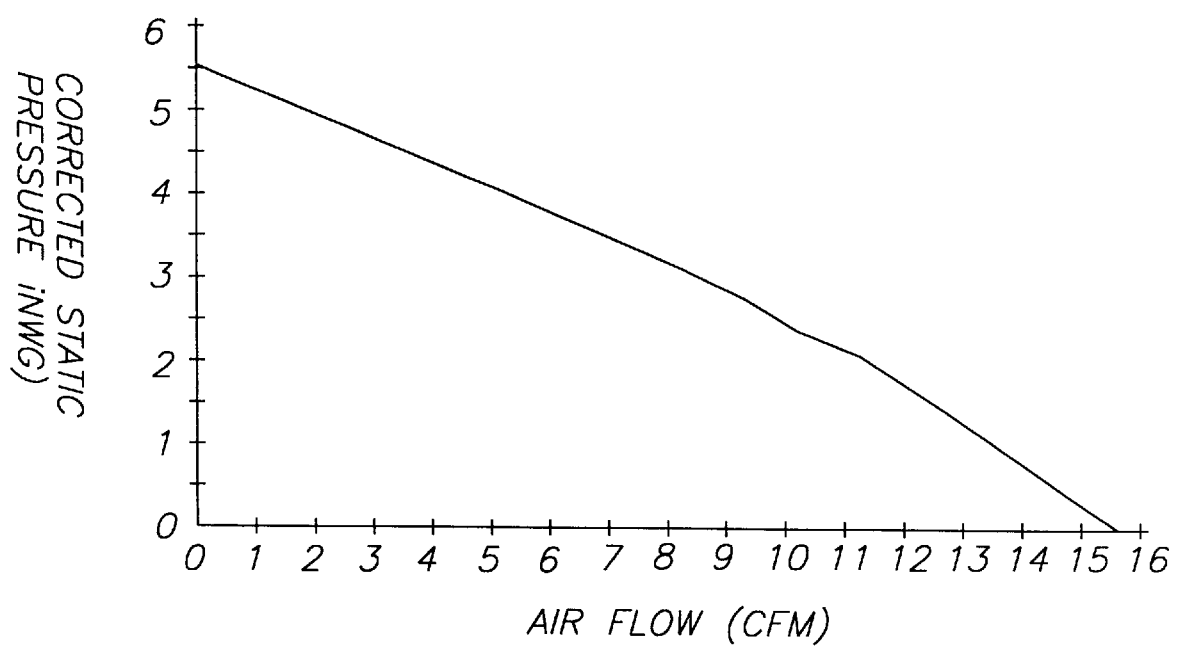
Figure 8:
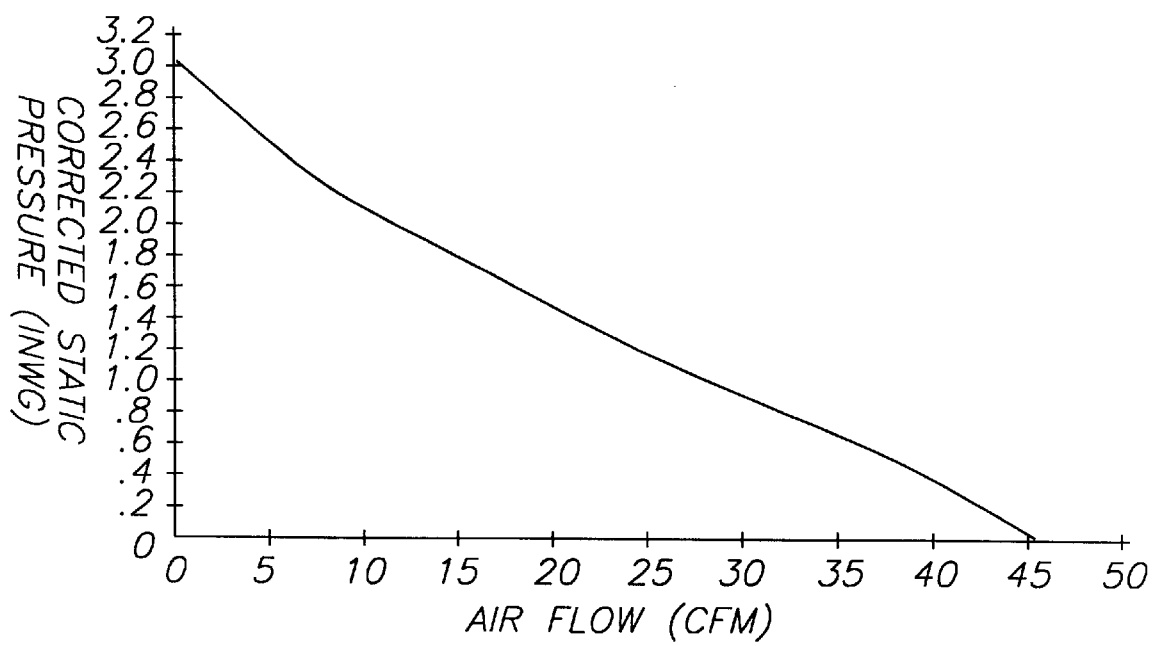

Furthermore, the preferred drive means or dc motor, 80, is configured to produce a static pressure up to about 8 inches of water. FIGS. 6, 7, and 8 show the air movers performance curve as a function of resistance to airflow (static pressure). The results generally indicate that this compact air mover 16 employing our planar motor technology is capable of achieving 20× increase in static pressure compared to a typical tubeaxial heat exchanger such as the one described in the prior art above. According to FIGS. 6, 7, 8, air mover performance curves are depicted for a backward curve impeller 14 (or wheel) where the outside dimension of the impeller 14 (wheel) is held constant. The inside diameter (or inlet area) of the impeller 14 (wheel) is then varied, which effects the slope of the air movers performance curve. Thus, by varying the impeller dimensions, an infinite amount of different air mover performance curves are obtainable. This applies to both the inlet diameter as well as the outside diameter.

Since size is an important feature of the invention, the preferred air moving means 16 of the invention has a height less than about 1.125 inches (cm) and a width of less than about 6 inches.

Enclosure (12)

Referring particularly to FIGS. 3 & 5, enclosure 12 preferably comprises an interior compartment 85 formed by adjoining sidewalls 86 and a top wall 90. One of the sidewalls 86e extends beyond the other adjoining sidewalls 86. The top wall 90 has opening 18 defining a fluid inlet end. A plenum chamber (not shown) is formed in interior compartment 85 between the opening, or fluid inlet end, 18, in the top wall 90 and the sidewall 86e that extends beyond the other sidewalls 86. The importance of plenum chamber of the invention is that it provides critical direction for fluid traveling from outside opening or fluid inlet end, 18 in the top wall 90 of the enclosure 12 into and through plenum chamber, then into the fluid inlet 64 of the heat sink 22. The integrated design of the enclosure or housing 12 results in a more efficient means of directing fluid or air to the area that will be the most beneficial. A dual purpose of the housing is to ensure that there is no airflow bypass; that is, all the air that enters and exists through the heat sink 22. In the embodiment of the invention depicted in FIGS. 2, 3 & 5, air moving means 16 having a backward curved impeller 14 (described above) is used to take in air through the opening 18 of the top wall 90 of the enclosure 12 and direct it through the fluid passageways 58, 62 in tiers 56, 60 of the heat sink 22. This greatly increases the thermal efficiency of the heat sink 22.

The invention has therefore been described with reference to certain embodiments thereof, but it will be understood that variations and modifications can be effected within the scope of the invention.

PARTS LIST

| | |
|---|---|
| 1 | prior art heat exchanger |
| 2 | prior art tubiaxial fan |
| 3 | prior art heat sink |
| 4 | prior art fins |
| 10 | heat exchanger |
| 12 | housing or enclosure |
| 14 | impeller |
| 16 | air moving means |
| 18 | opening or air inlet end |
| 20 | backward curved blades of impeller |
| 22 | heat sink |
| 24 | first base element of heat sink 22 |
| 26 | second base element of heat sink 22 |
| 30 | bridging element of heat sink 22 |
| 32 | common first of first base element 24 |
| 34 | first fins of first base element 24 |
| 36 | first recess in common first face 32 |
| 38 | common third face of bridging element 30 |
| 40 | third fins in common third face 38 |
| 42 | third recesses in common third face 38 |
| 44 | common fourth face of bridging element 30 |
| 46 | fourth fins in common fourth face 44 |
| 48 | fourth recesses in common fourth face 44 |
| 50 | common second face of second base element 24 |
| 52 | second fins in common second face 50 |
| 54 | second recesses in common second face 50 |
| 56 | first tier of heat sink 22 |
| 58 | first fluid passageways in first tier 56 |
| 60 | second tier of heat sink 22 |

-continued

PARTS LIST

| | |
|---|---|
| 62 | second fluid passageways of second tier 60 |
| 64 | air inlet of heat sink 22 |
| 66 | air outlet of heat sink 22 |
| 70 | permanent magnet |
| 72 | drive shaft |
| 74 | bearings |
| 76 | base plate |
| 78 | flux return plate |
| 80 | drive means or motor |
| 82 | circuit board |
| 84 | metallic coils |
| 85 | interior compartment of enclosure 12 |
| 90 | top wall of enclosure 12 |

What is claimed is:

1. A heat exchanger, comprising:

a heat sink having extruded first and second base elements and an extruded bridging element, said first base element having a plurality of parallel first fins extending outwardly from a common first face with nearest adjacent first fins having a first recess formed therebetween in said common first face; said second base element having a plurality of parallel second fins extending outwardly from a common second face with nearest adjacent second fins having a second recess formed therebetween in said common second face; and said bridging element having a third common face and an opposing fourth common face, said third common face having a plurality of alternating first crest, each one of said alternating first crest having a third fin extending outwardly therefrom with nearest adjacent third fins having a third recess formed therebetween in said common third face, and wherein said fourth common face has a plurality of alternating second crest, each one of said second crest having a fourth fin extending outwardly therefrom with nearest adjacent fourth fins having a fourth recess formed in said common fourth face; and, wherein said bridging element is arranged between said first and second base elements in a manner such that an end edge portion of each of said first fins is fixedly bonded in an opposing third recess in said bridging element and an end edge portion of each of said third fins is fixedly bonded in an opposing first recess of said first base element thereby forming a plurality of first fluid passageways between said first and third fins, and wherein an end edge portion of each of said second fins of said second base elements is fixed in a fourth recess of said bridging element and an end edge portion of each of said fourth fins of said common fourth face is fixedly bonded in a second recess of said second base element thereby forming a plurality of second fluid passageways between said second and fourth fins;

an air moving means structurally connected to said heat sink, said air moving means comprising at least a partial enclosure configured to direct fluid from outside said at least partial enclosure into and through said at least partial enclosure; an impeller arranged for rotational movement in said at least partial enclosure, said impeller having a plurality of backward curved blades exposed to an opening in said at least partial enclosure for convectively moving fluid into said at least partial enclosure and through said plurality of first and second fluid passageways of said heat sink, said impeller being capable of producing a fluid velocity and static pressure to force said fluid outside said at least partial enclosure through the closely spaced fins of said heat sink; and, drive means operably connected to said impeller for producing the rotational movement of said impeller.

2. The heat exchanger recited in claim 1, wherein said at least partial enclosure comprises an interior compartment formed by adjoining sidewalls, one of said sidewalls extending beyond the other adjoining sidewalls, and a top wall, said top wall having an opening defining a fluid inlet end and wherein said interior compartment between said fluid inlet end and sidewall extending beyond said other sidewalls defines a plenum chamber for directing air from said top wall of said at least partial enclosure into and through said plenum chamber and then into said fluid inlet face of said heat sink.

3. The improved heat exchanger recited in claim 1, wherein said drive means comprises a small compact dc motor.

4. The improved heat exchanger recited in claim 3, wherein said drive means further comprises a circuit board having a plurality of metallic coils arranged in magnetic proximity to said impeller, said ferromagnetic coils being configured to receive a current and thereby produce rotational movement of said impeller in response to said current.

5. The improved heat exchanger recited in claim 4, wherein said dc motor is configured to produce an impeller speed of about 4000 RPM to about 15000 RPM.

6. The improved heat exchanger recited in claim 3, wherein said dc motor is configured to produce a static pressure up to about 8 inches of water.

7. The improved heat exchanger recited in claim 1, wherein each of said plurality of fins is generally planar.

8. The improved heat exchanger recited in claim 1, wherein said plurality of first, second, third and fourth fins have a heat transfer coefficient (h) up to about 20 Btu/hr. ft$^2$ deg F.

9. The improved heat exchanger recited in claim 1, wherein said first and second fluid passageways have an average space width of around 3½ to 4 times the thickness of any one of said first, second, third and fourth plurality of fins.

10. The heat exchanger recited in claim 1, wherein said air moving means has a height less than about 1.125 inches (2.8575 cm) and a width of less than about 6 inches (15.24 cm).

* * * * *